(12) United States Patent
Huang

(10) Patent No.: US 8,969,869 B2
(45) Date of Patent: Mar. 3, 2015

(54) INTEGRATED CIRCUIT WAFER AND INTEGRATED CIRCUIT DIE

(75) Inventor: Yao-Sheng Huang, Kaohsiung (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 783 days.

(21) Appl. No.: 12/944,160

(22) Filed: Nov. 11, 2010

(65) Prior Publication Data

US 2011/0114950 A1   May 19, 2011

(30) Foreign Application Priority Data

Nov. 13, 2009  (TW) .............................. 98138614 A

(51) Int. Cl.
| H01L 29/72 | (2006.01) |
| H01L 23/00 | (2006.01) |
| H01L 21/56 | (2006.01) |
| H01L 21/66 | (2006.01) |
| H01L 23/31 | (2006.01) |

(52) U.S. Cl.
CPC .............. *H01L 24/97* (2013.01); *H01L 21/561* (2013.01); *H01L 22/34* (2013.01); *H01L 23/3171* (2013.01); *H01L 23/562* (2013.01); *H01L 23/3114* (2013.01); *H01L 2924/19041* (2013.01); *H01L 2924/01019* (2013.01); *H01L 2924/01033* (2013.01); *H01L 2924/1515* (2013.01)

USPC .. 257/48; 257/506; 257/E29.02; 257/E29.169

(58) Field of Classification Search
USPC ....................... 257/48, 506, E29.02, E29.169
See application file for complete search history.

(56) References Cited

U.S. PATENT DOCUMENTS

2002/0037651 A1 *   3/2002   Lee ............................... 438/710

* cited by examiner

*Primary Examiner* — Edward Wojciechowicz

(57) ABSTRACT

An integrated circuit wafer and integrated circuit dice are provided. The integrated circuit wafer includes a wafer substrate, a plurality of integrated circuits, a plurality of test-keys, an isolation film, and a plurality of ditches. The integrated circuits are disposed on the wafer substrate in matrix. The test-keys are respectively disposed between the adjacent integrated circuits. The isolation film covers at least one side of the integrated circuits on the wafer substrate. The ditches extend downwardly from the surface of the isolation film and are disposed between the integrated circuit and the adjacent test-key. The integrated circuit die includes a wafer substrate, an integrated circuit disposed on the wafer substrate, and an isolation film covering at least one side of the integrated circuit on the wafer substrate, wherein the side walls of the wafer substrate and the isolation film are respectively smooth walls. The side wall of the wafer substrate is substantially vertical.

14 Claims, 8 Drawing Sheets

INTEGRATED CIRCUIT WAFER AND INTEGRATED CIRCUIT DIE

BACKGROUND OF THE INVENTION

1. Field of the Invention

This invention generally relates to an integrated circuit wafer and an integrated circuit die.

2. Description of the Prior Art

A wafer is a substrate for manufacturing integrated circuits. Using integrated circuits fabrication technology, through a series of complicated chemical, physical, and optical processes, a fabricated integrated circuit wafer can include thousands of integrated circuit dice. After being tested, cut, and packaged, the dice can be formed into various integrated circuit products having different functions.

As shown in FIGS. 1A and 1B which shows a cross sectional view of area 80 of FIG. 1A indicated by PP, the conventional integrated circuit wafer 90 includes a wafer substrate 100, a plurality of integrated circuits 300, a plurality of test-keys 400, and an isolation film 500. In a conventional wafer dicing process, an external force K is applied to the integrated circuit wafer 90 along a path between two adjacent integrated circuits 300 by a cutter. Because the cutter is directly applied onto the integrated circuit wafer 90, cracks and damages of the integrated circuit wafer 90 will be produced by the dicing stress. On the other hand, the test-keys 400 are distributed between the integrated circuits 300, i.e. on the dicing path. Therefore, the yield rate will be decreased due to metal ashes generated from cutting the test-key during the dicing process. Therefore, it is desired to improve the conventional integrated circuit wafer and the dicing method thereof.

SUMMARY

It is an object of the present invention to provide an integrated circuit wafer which can be separated into integrated circuit dice with improved yield rate.

It is another object of the present invention to provide an integrated circuit die with improved yield rate.

It is another object of the present invention to provide an integrated circuit wafer dicing method having improved yield rate in dicing the integrated circuit wafer.

The integrated circuit wafer includes a wafer substrate, a plurality of integrated circuits, a plurality of test-keys, an isolation film, and a plurality of ditches. The integrated circuits are disposed on the wafer substrate in matrix. The test-keys are respectively disposed between the adjacent integrated circuits. The isolation film covers at least one side of the integrated circuits on the wafer substrate. The ditches extend downwardly from the upper surface of the isolation film between the integrated circuit and the adjacent test-key.

The plurality of test-keys are used for wafer acceptance test. The plurality of test-keys include a transistor, a capacitor, a resistor, an n-type semiconductor, a p-type semiconductor, a p-n-type semiconductor, a metal wire component, or a combination thereof. The isolation film includes silicon dioxide or silicon nitride. The plurality of ditches extend to the wafer substrate, wherein an upper surface of the wafer substrate serves as the bottom of the ditches. Alternatively, the plurality of ditches can extend into the wafer substrate. The side walls of the plurality of ditches are etching walls. The side walls of the plurality of ditches can be smooth walls. The side walls of the plurality of ditches are substantially vertical. The angle between the side wall of the ditch and the upper surface of the wafer substrate is between 88° and 90°. The width of the ditch is smaller than 5 μm.

The integrated circuit die includes a wafer substrate, an integrated circuit disposed on the wafer substrate, and an isolation film covering at least one side of the integrated circuit on the wafer substrate, wherein the side walls of the wafer substrate and the isolation film are respectively smooth walls. The side wall of the wafer substrate is substantially vertical. The angle between the side wall of the wafer substrate and the surface of the wafer substrate is between 88° and 90°. The side wall of the isolation film is substantially vertical. The angle between the side wall of the isolation film and the surface of the wafer substrate is between 88° and 90°. The isolation film includes silicon dioxide or silicon nitride. The side wall of the isolation film is an etching wall. The side wall of the wafer substrate and the side wall of the isolation film are coplanar. Alternatively, the side wall of the wafer substrate protrudes out of the side wall of the isolation film. The upper edge of the side wall of the wafer substrate and the side wall of the isolation film are coplanar, wherein the lower edge of the side wall of the wafer substrate protrudes out of the side wall of the isolation film.

The method includes forming a plurality of integrated circuits and a plurality of test-keys on a wafer substrate, wherein the integrated circuits are disposed on the wafer substrate in matrix, the test-keys are respectively disposed between the adjacent integrated circuits; forming an isolation film to cover at least one side of the integrated circuits on the wafer substrate; forming a plurality of ditches extending downwardly from the upper surface of the isolation film between the integrated circuit and the adjacent test-key; and applying an external force to an area of the isolation film between two adjacent ditches to make the wafer substrate separate from the bottom of at least one of the two adjacent ditches along the lattice of the wafer substrate.

The step of forming the isolation film includes forming the isolation film by chemical vapor deposition or physical vapor deposition. The step of forming the ditch includes forming the plurality of ditches by etching. The step of forming the ditch includes extending the plurality of ditches to the upper surface of the wafer substrate. Alternatively, the step of forming the ditch includes extending the plurality of ditches into the wafer substrate. The side walls of the plurality of ditches are substantially vertical. The angle between the side wall of the ditch and the upper surface of the wafer substrate is between 88° and 90°. The width of the ditch is smaller than 5 μm. The step of applying the external force includes driving a pressure-applying tool to move along an area of the isolation film between two adjacent ditches to break the wafer substrate into integrated circuit dice.

DETAILED DESCRIPTION OF THE PREFERRED EMBODIMENT

Figure 1A:
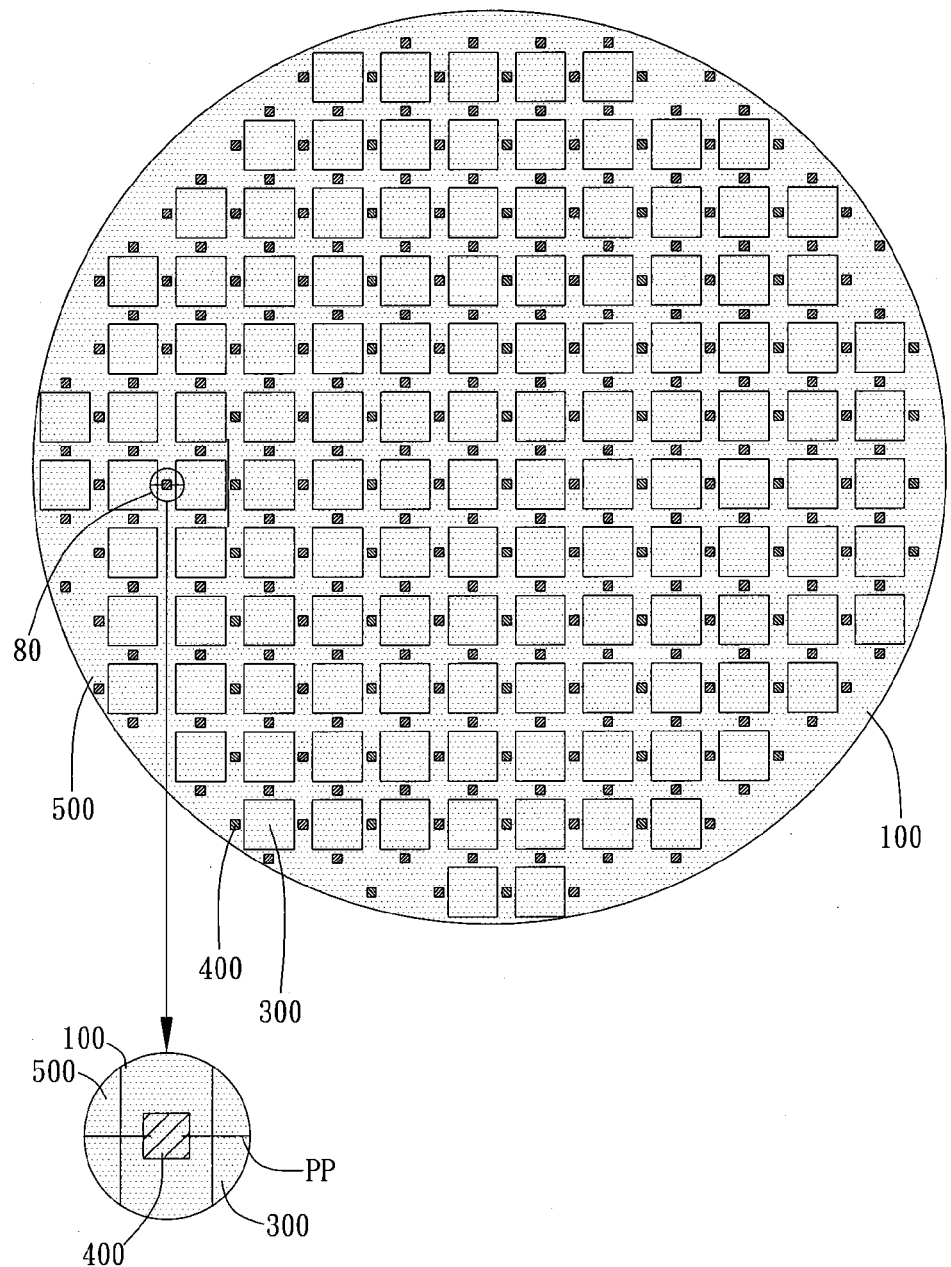
FIGS. 1A and 1B are schematic views of the prior art.
Figure 1B:
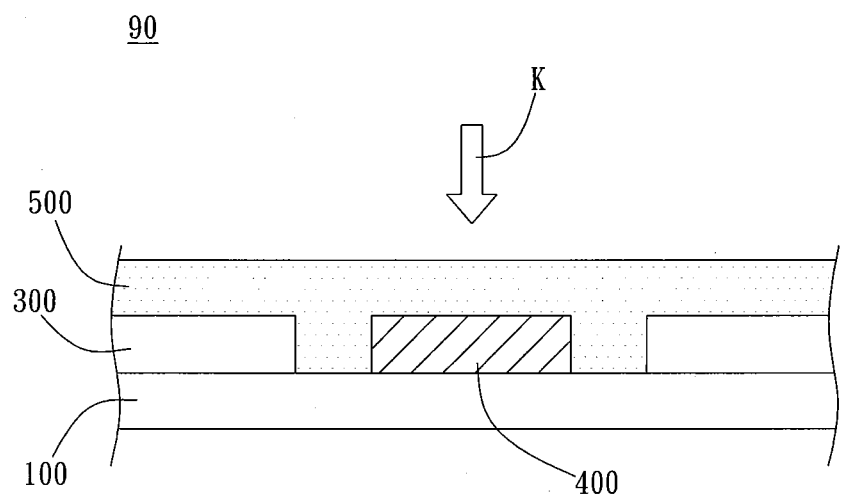
Figure 2A:
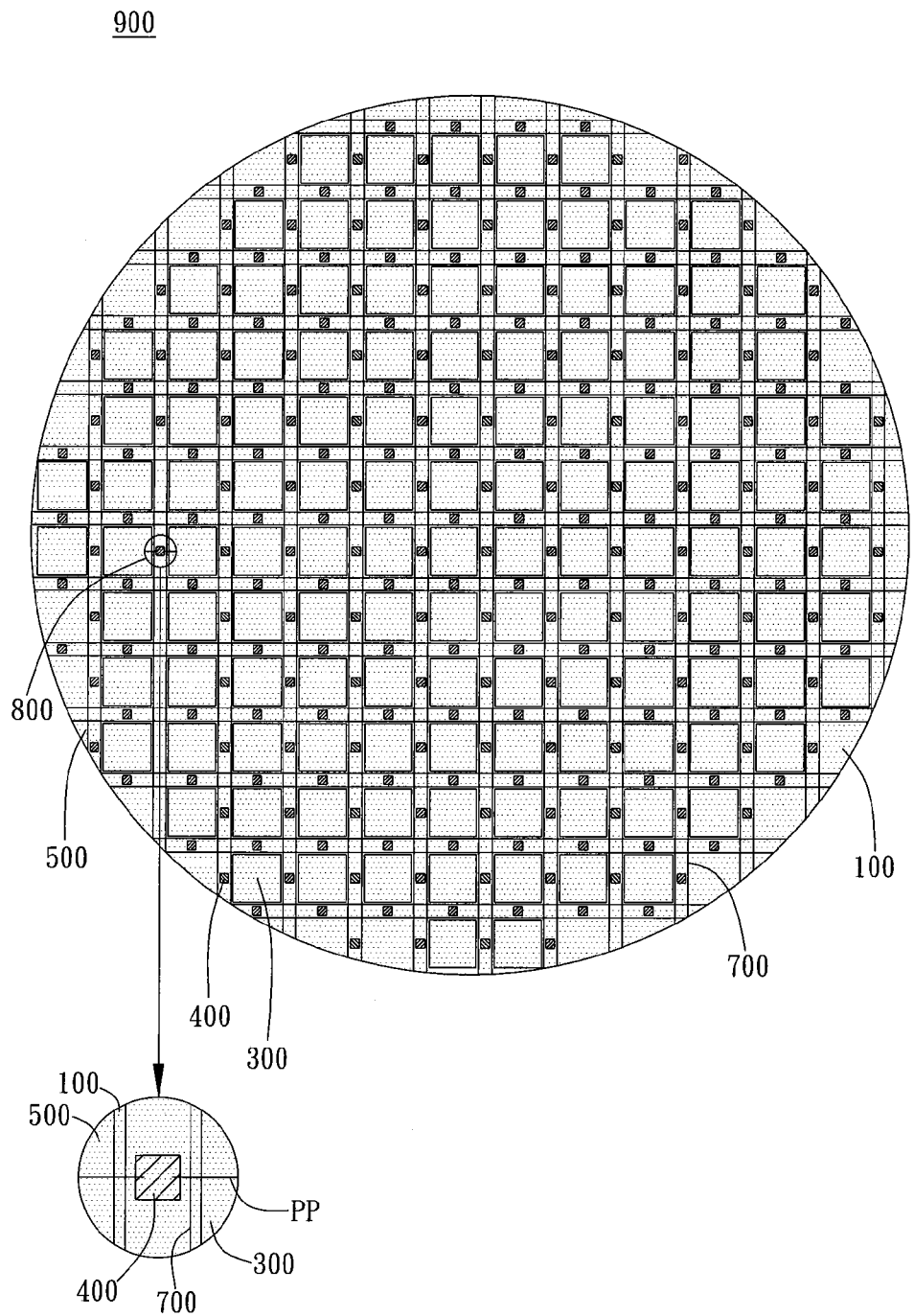
FIG. 2A is a top plan view of an embodiment of the present invention.
Figure 2B:
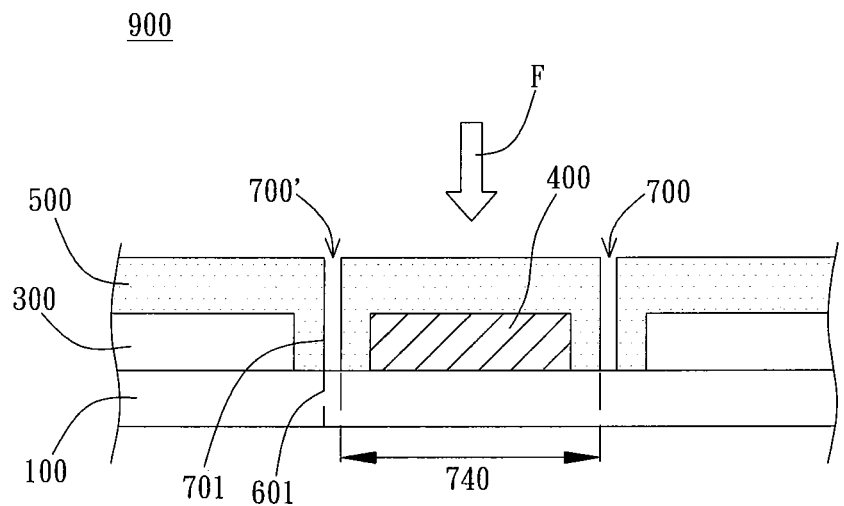
FIG. 2B to 3B are schematic views of different embodiments of the present invention.

As shown in FIGS. 2A and 2B which is a cross sectional view of area 800 of FIG. 2A indicated by PP, the integrated circuit wafer 900 of the present invention includes a wafer substrate 100, a plurality of integrated circuits 300, a plurality of test-keys 400, an isolation film 500, and a plurality of ditches 700. The integrated circuits 300 are disposed on the wafer substrate 100 in matrix. More particularly, as the embodiment shown in FIG. 2A, a unit square represents one integrated circuits 300 on the wafer substrate 100, wherein the integrated circuits 300 are aligned and arranged in matrix for manufacturing and dicing. However, the shape and the arrangement of the integrated circuits 300 are not limited by the above embodiment. For example, the integrated circuit 300 can have rectangular or any suitable geometric shape and arranged in any manner as appropriate.

The test-keys 400 are respectively disposed between adjacent integrated circuits 300. For example, the test-keys 400 are disposed on a dicing path, wherein the dicing path is defined as a path for dicing the wafer substrate 100 to form a plurality of dice of integrated circuits 300. The plurality of test-keys 400 are used for wafer acceptance test. More particularly, the acceptance of the wafer substrate 100, i.e. the quality of the wafer substrate 100, can be obtained by carrying out an electrical test onto the plurality of test-keys 400 distributed on the wafer substrate 100 before dicing the wafer substrate 100. The plurality of test-keys 400 may include a transistor, a capacitor, a resistor, an n-type semiconductor, a p-type semiconductor, a p-n-type semiconductor, a metal wire component, etc. Moreover, the test-keys 400 can include a combination of devices described above.

The isolation film 500 covers at least one side of the integrated circuits 300 on the wafer substrate 100. More particularly, as the embodiment shown in FIG. 2B, the integrated circuits 300 and the test-key 400 are disposed on the wafer substrate 100, wherein the isolation film 500 covers the integrated circuits 300, the test-key 400, and exposed portions of the wafer substrate 100 which are not occupied by the integrated circuits 300 and the test-keys 400. For example, the isolation film 500 can be a blanket isolation film substantially covering all sides of each integrated circuit 300 or test-key 400 except the side in contact with the wafer substrate 100. That is, the isolation film 500 also fills the gaps between integrated circuits 300 and the test-keys 400. The isolation film 500 may include silicon dioxide, silicon nitride, or any suitable isolation material, wherein the isolation film 300 can be formed by chemical vapor deposition (CVD), physical vapor deposition (PVD), or any semiconductor growth method as appropriate.

As the embodiments shown in FIGS. 2A and 2B, the ditches 700 extend downwardly from the surface (i.e. upper surface) of the isolation film 500 and are disposed between the integrated circuit 300 and the adjacent test-key 400. In other words, each test-key 400 and an adjacent integrated circuit 300 are separated by a ditch 700. As the embodiment shown in FIG. 2B, the plurality of ditches 700 extend to the upper surface 110 of the wafer substrate 100, wherein the upper surface 110 of the wafer substrate 100 serves as the bottom of the ditches 700. In a preferred embodiment, the ditches 700 are formed by etching process, wherein a dry plasma etching process is preferred. However, in other embodiments, the ditches 700 can be formed by wet chemical etching process. Since the ditches 700 are formed by etching process, the side walls 701 of the ditches 700 are etching walls. As shown in FIG. 2B, the side walls 701 of the ditches 700 are relatively smooth walls and are substantially vertical, i.e. the angle between the side wall 701 of the ditch 700 and the upper surface 110 of the wafer substrate 100 is between 88° and 90°. The width of the ditch 700 is preferably smaller than 5 μm.

Because the wafer substrate 100 is an epitaxially-formed crystalline structure having uniform lattice, the wafer substrate 100 will separate from the bottom of at least one of two adjacent ditches 700 along the lattice of the wafer substrate 100 when an external force F is applied to an area 740 of the isolation film 500 between the two adjacent ditches 700. For example, the area 740 is where the test-keys 400 is disposed, i.e. the dicing path. As the embodiment shown in FIG. 2B, the wafer substrate 100 separates from the bottom of the ditches 700' along the lattice of the wafer substrate 100. On the other hand, since the wafer substrate 100 separates along the lattice of the wafer substrate 100, the separated side wall 101 of the wafer substrate 100 is a relatively smooth wall, as shown in FIG. 3. In other words, the integrated circuit wafer 900 of the present invention can be separated into integrated circuit dice 910 shown in FIG. 2C without using the cutting tool to carry out the dicing step between the integrated circuits 300 like the prior art did. Therefore, the present invention not only is convenient but also can solve the problem of yield rate decreasing caused by metal ashes, wherein the metal ashes are produced from cutting and damaging the test-key during dicing in the prior art.

Figure 2C:
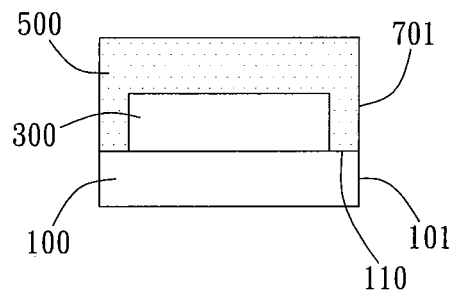

As the embodiment shown in FIG. 2C, the integrated circuit die 910 separated from the integrated circuit wafer 900 of the present invention includes a wafer substrate 100, an integrated circuit 300 disposed on the wafer substrate 100, and an isolation film 500 covering at least one side of the integrated circuit 300 on the wafer substrate 100. More particularly, the integrated circuit 300 is disposed on the wafer substrate 100, wherein the isolation film 500 covers the integrated circuit 300 and the exposed portion of the wafer substrate 100 which is not occupied by the integrated circuit 300. The side walls 101 of the wafer substrate 100 and the side walls 701 of the isolation film 500 are relatively smooth walls, respectively. More particularly, the side walls 701 of the isolation film 500 are essentially the side walls 701 formed by etching process in the above mentioned embodiment shown in FIG. 2B, which are etching walls and are substantially vertical. That is, the angle between the side wall 701 and the surface 110 of the wafer substrate 100 is between 88° and 90°.

In the embodiment shown in FIG. 2C, i.e. in the integrated circuit die 910, the side wall 101 of the wafer substrate 100 and the side wall 701 of the isolation film 500 are coplanar. In other words, as shown in FIG. 2B, the wafer substrate 100 separates along the path 601 of the lattice of the wafer substrate 100 when the external force F is applied to the area 740 of the isolation film 500 between two adjacent ditches 700. The side wall 701 of the isolation film 500 of the integrated circuit die 910 separated from the integrated circuit wafer 900 is aligned with the side wall 101 of the wafer substrate 100, as shown in FIG. 2C. Because the side wall 101 is formed by separating the wafer substrate 100 along the lattice, the surface properties of the side wall 101 are the same as a smooth wafer surface. The side wall 701 is formed by etching the isolation film 500 and has surface properties substantially same with the surface properties of a smooth isolation film.

Figure 2D:
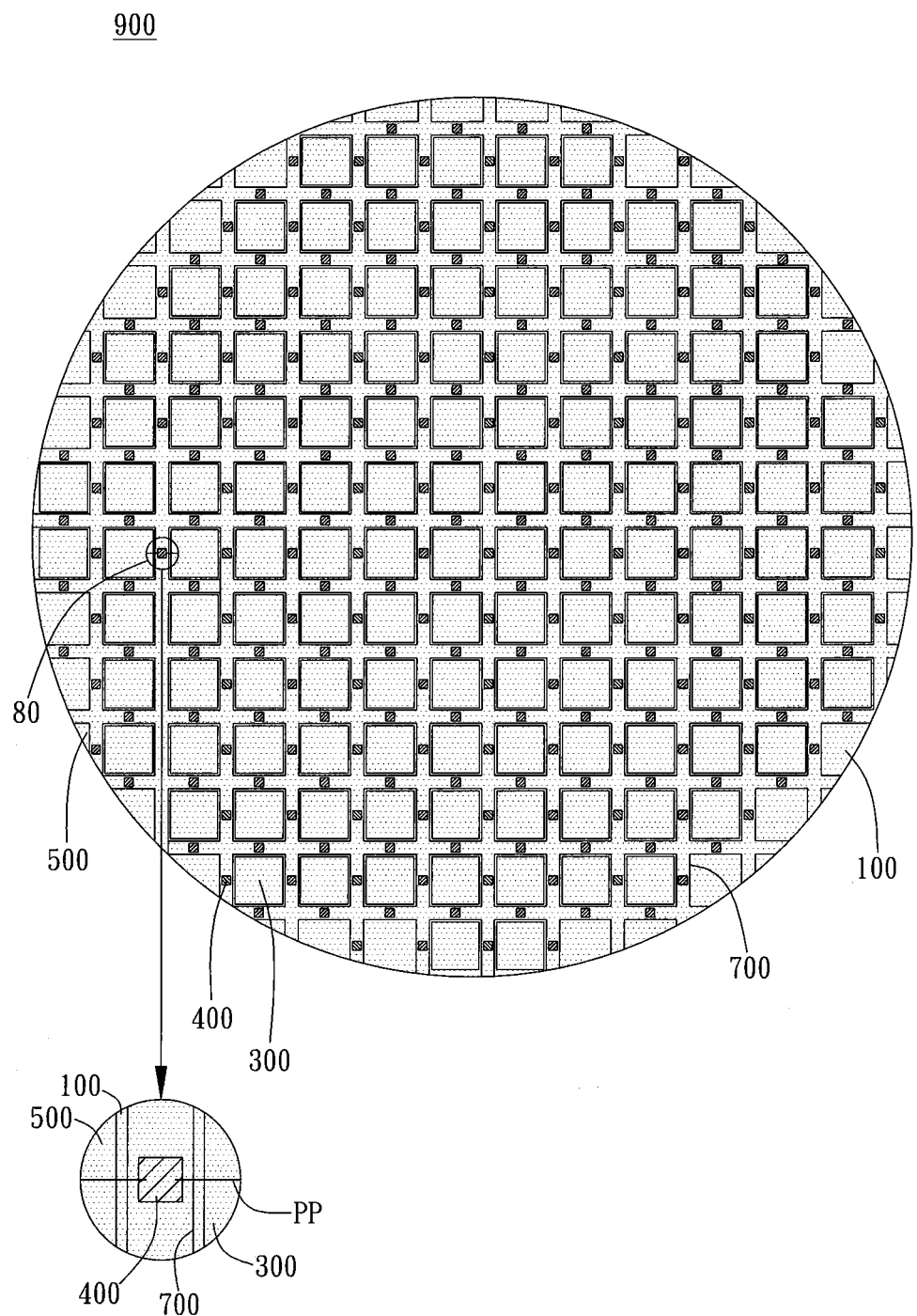

The distribution of ditches 700 can be modified according to different demands. In the embodiment shown in FIG. 2A, the ditches 700 are straight lines connect two points on the circumference of the wafer substrate 100, i.e. the ditches 700 can be regards as chords of the wafer substrate 100. However, in a different embodiment shown in FIG. 2D, the ditches 700 are lines surrounding the integrated circuits 300 in square loop, wherein the square loops of adjacent ditches 700 are not connected to each other.

Figure 3A:
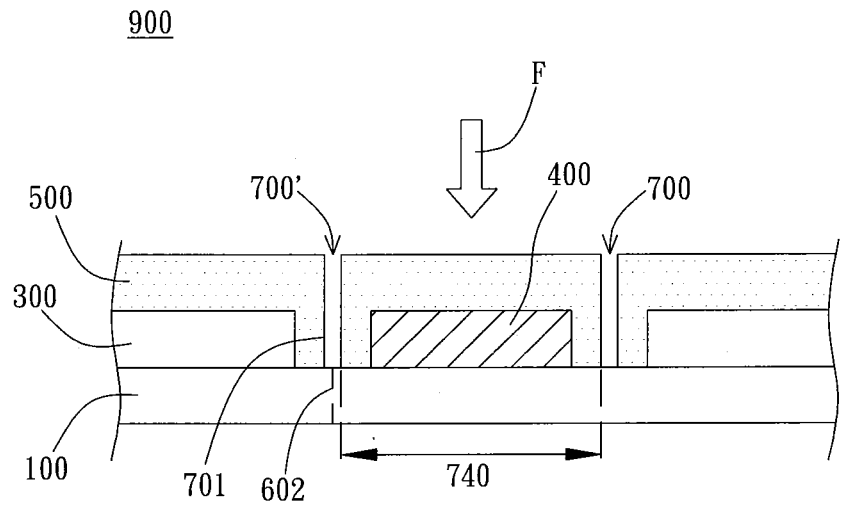
Figure 3B:
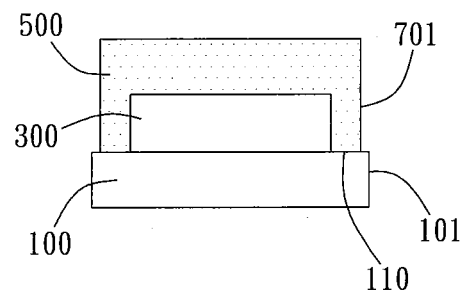

In different embodiments, because the bottom of the ditch 700 has a certain width, the wafer substrate 100 may separate downwardly from different location on the bottom of the ditch 700 along the lattice of the wafer substrate 100. As shown in FIG. 3A, the wafer substrate 100 separates along the path 602 of the lattice of the wafer substrate 100 when the external force F is applied to the area 740 of the isolation film 500 between two adjacent ditches 700, wherein the side wall 101 of the wafer substrate 100 of the integrated circuit die 910 separated from the integrated circuit wafer 900 protrudes out of the side wall 701 of the isolation film 500, as shown in FIG. 3B.

Figure 4A:
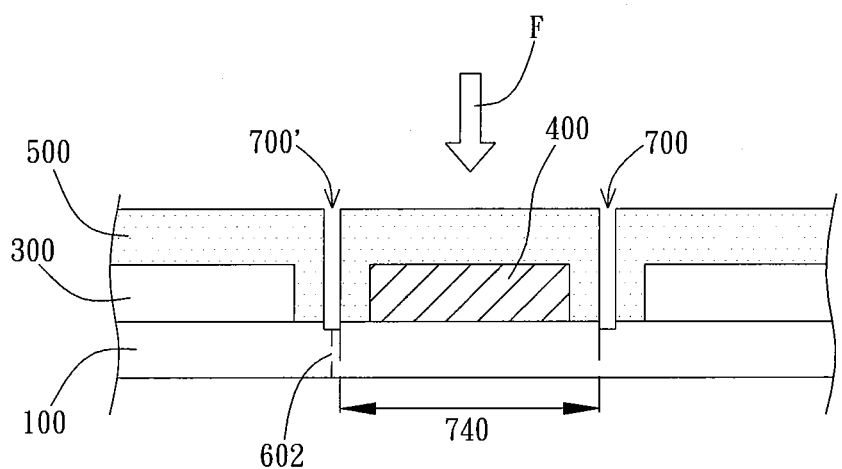
FIGS. 4A and 4B are schematic views of preferred embodiments of the present invention.
Figure 4B:
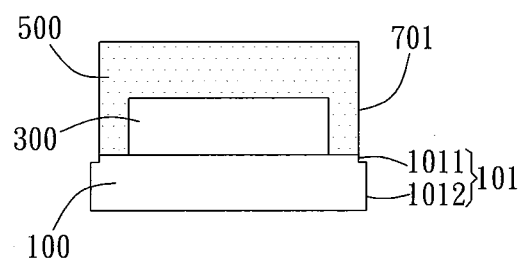

On the other hand, as the embodiment shown in FIG. 4A, the ditches 700 can further extend into the wafer substrate 100. The wafer substrate 100 separates along the path 602 of the lattice of the wafer substrate 100 when the external force F is applied to the area 740 of the isolation film 500 between two adjacent ditches 700. The formed integrated circuit die 910 is shown in FIG. 4B, wherein the upper edge 1011 of the side wall 101 of the wafer substrate 100 and the side wall 701 of the isolation film 500 are coplanar, and the lower edge 1012 of the side wall 101 of the wafer substrate 100 protrudes out of the side wall 701 of the isolation film 500.

Figure 5:
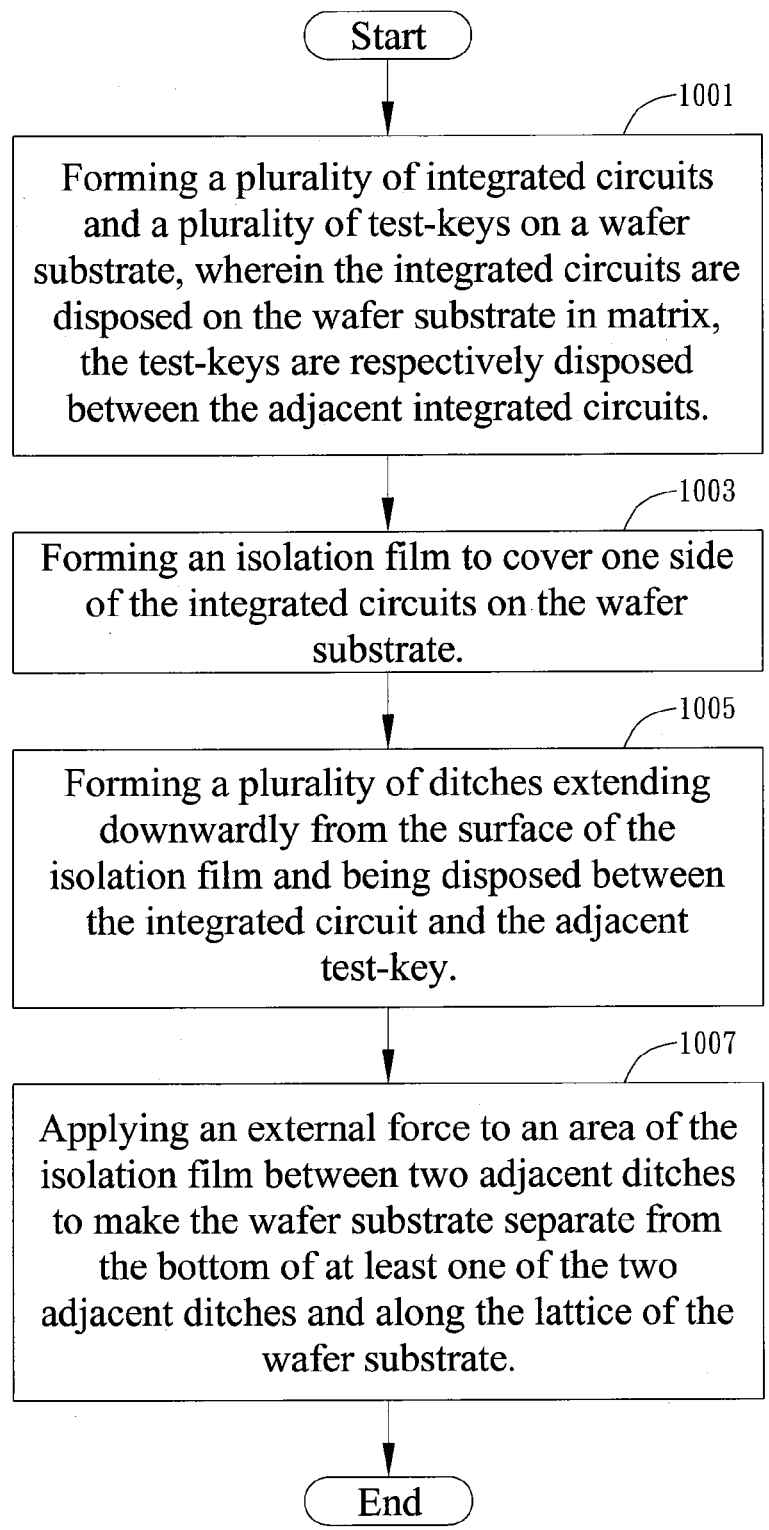
FIG. 5 is a flow chart of the integrated circuit wafer dicing method of the present invention.

As shown in FIG. 5, the integrated circuit wafer dicing method of the present invention includes the following steps.

Step 1001, the step of forming a plurality of integrated circuits and a plurality of test-keys on a wafer substrate is performed, wherein the integrated circuits are disposed on the wafer substrate in matrix, and the test-keys are respectively disposed between adjacent integrated circuits. More particularly, the integrated circuits and the test-keys are formed on the wafer substrate by semiconductor processing steps such as forming oxide layer, coating photo-resist layer, exposing with a mask, developing, etching, removing photo-resist layer, adding impurities, etc. The integrated circuit and the test-key can be formed simultaneously or by different semiconductor processes. The location of integrated circuits and test-keys can be controlled by a pattern of the mask.

Step 1003, the step of forming an isolation film to cover at least one side of the integrated circuits on the wafer substrate is performed. The isolation film can be a blanket isolation film formed by chemical vapor deposition or physical vapor deposition. The isolation film may include silicon dioxide, silicon nitride, or any suitable isolation material known in the art.

Step 1005, the step of forming a plurality of ditches extending downwardly from the upper surface of the isolation film between the integrated circuit and the adjacent test-key is performed. The ditches are formed by etching. In an embodiment, a dry plasma etching process is preferred. However, in other embodiments, the ditches 700 can be formed by wet chemical etching process or laser cutting. The plurality of ditches can extend to the surface 110 of the wafer substrate 100 as shown in FIG. 2B or extend into the wafer substrate 100 as shown in FIG. 4A.

Step 1007, the step of applying an external force to an area of the isolation film between two adjacent ditches to make the wafer substrate separate from the bottom of at least one of the two adjacent ditches along the lattice of the wafer substrate is performed. The step of applying the external force includes driving a pressure-applying tool to move along the area of the isolation film between two adjacent ditches to break the wafer substrate into integrated circuit dice, wherein the pressure applying tool can be a cutting tool which serves as a tool for applying force, instead of a tool for dicing. In other embodiments, a pressing plate can be used to apply the external force to the area of the isolation film between two adjacent ditches to separate the wafer substrate.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. An integrated circuit wafer, comprising:
   a wafer substrate;
   a plurality of integrated circuits disposed on the wafer substrate in matrix;
   a plurality of test-keys respectively disposed between the adjacent integrated circuits;
   an isolation film covering at least one side of the integrated circuits on the wafer substrate; and
   a plurality of ditches extending downwardly from a surface of the isolation film between the integrated circuit and the adjacent test-key and extending longitudinally along at least one entire side of one integrated circuit.

2. The integrated circuit wafer of claim 1, wherein the plurality of test-keys are used for wafer acceptance test.

3. The integrated circuit wafer of claim 1, wherein the plurality of test-keys include a transistor, a capacitor, a resistor, an n-type semiconductor, a p-type semiconductor, a p-n-type semiconductor, a metal wire component, or a combination thereof.

4. The integrated circuit wafer of claim 1, wherein the isolation film includes silicon dioxide or silicon nitride.

5. The integrated circuit wafer of claim 1, wherein the plurality of ditches extend down to the wafer substrate, and a surface of the wafer substrate serve as a bottom of the ditch.

6. The integrated circuit wafer of claim 1, wherein the plurality of ditches extend into the wafer substrate.

7. The integrated circuit wafer of claim 1, wherein the side walls of the plurality of ditches are substantially vertical.

8. The integrated circuit wafer of claim 7, wherein an angle between the side wall of the ditch and a surface of the wafer substrate is between 88° and 90°.

9. The integrated circuit wafer of claim 1, wherein the width of the ditch is smaller than 5 μm.

10. The integrated circuit wafer of claim 1, wherein the plurality of ditches extend longitudinally along at least two adjacent integrated circuits.

11. The integrated circuit wafer of claim 1, wherein the plurality of ditches are exposed.

12. The integrated circuit wafer of claim 1, wherein the plurality of ditches have a length that is longer than an entire side of one test-key.

13. The integrated circuit wafer of claim 1, wherein the plurality of ditches extend longitudinally along at least two sides of one integrated circuit.

14. The integrated circuit wafer of claim 1, wherein the plurality of ditches are non-conductive.

\* \* \* \* \*